(12) United States Patent
Letize et al.

(10) Patent No.: US 7,989,346 B2
(45) Date of Patent: Aug. 2, 2011

(54) SURFACE TREATMENT OF SILICON

(76) Inventors: Adam Letize, Wallingford, CT (US);
Andrew M. Krol, Bristol, CT (US);
Ernest Long, Burlington, CT (US);
Steven A. Castaldi, Torrington, CT (US)

( * ) Notice: Subject to any disclaimer, the term of this patent is extended or adjusted under 35 U.S.C. 154(b) by 0 days.

(21) Appl. No.: 12/509,619

(22) Filed: Jul. 27, 2009

(65) Prior Publication Data

US 2011/0021023 A1     Jan. 27, 2011

(51) Int. Cl.
*H01L 21/44* (2006.01)

(52) U.S. Cl. .................. 438/674; 438/98; 257/E21.039

(58) Field of Classification Search .................. 438/674, 438/98; 257/E21.001, E21.002, E21.035–E21.039
See application file for complete search history.

(56) References Cited

U.S. PATENT DOCUMENTS

| | | | |
|---|---|---|---|
| 3,754,979 A * | 8/1973 | Larry | 428/447 |
| 4,139,483 A * | 2/1979 | Williams et al. | 430/108.2 |
| 4,507,181 A | 3/1985 | Nath et al. | |
| 5,279,682 A | 1/1994 | Wald et al. | |
| 5,309,632 A * | 5/1994 | Takahashi et al. | 29/852 |
| 5,698,451 A | 12/1997 | Hanoka | |
| 5,972,517 A * | 10/1999 | Kondo et al. | 428/446 |
| 6,159,865 A | 12/2000 | Kezuka et al. | |
| 6,184,057 B1 | 2/2001 | Van Andel et al. | |
| 6,479,316 B1 | 11/2002 | Hanoka et al. | |
| 6,593,077 B2 | 7/2003 | Faur et al. | |
| 6,607,936 B2 | 8/2003 | Nomura | |
| 7,196,018 B2 | 3/2007 | Szlufcik et al. | |
| 7,339,110 B1 | 3/2008 | Mulligan et al. | |
| 7,422,922 B2 | 9/2008 | Morooka et al. | |
| 7,501,229 B2 | 3/2009 | Hiroi et al. | |
| 2003/0035917 A1 | 2/2003 | Hyman | |
| 2005/0252544 A1 | 11/2005 | Rohatgi et al. | |
| 2009/0056798 A1 | 3/2009 | Merchant et al. | |
| 2009/0071532 A1 | 3/2009 | Chan et al. | |
| 2009/0162972 A1 * | 6/2009 | Xu et al. | 438/98 |

* cited by examiner

*Primary Examiner* — Alexander Ghyka
*Assistant Examiner* — Leonard Chang
(74) *Attorney, Agent, or Firm* — Carmody & Torrance LLP

(57) ABSTRACT

A method of forming a resist pattern on a silicon semiconductor substrate having an anti-reflective layer thereon is described. The method includes the steps of a) modifying surface energy of the anti-reflective surface with a chemical treatment composition, b) applying a UV etch resist to the treated anti-reflective surface, and c) exposing the anti-reflective surface to a wet chemical etchant composition to remove exposed areas of the anti-reflective surface. Thereafter, the substrate can be metallized to provide a conductor pattern. The method may be used to produce silicon solar cells.

7 Claims, 1 Drawing Sheet

SURFACE TREATMENT OF SILICON

FIELD OF THE INVENTION

The present invention relates generally to the treatment of an anti-reflective surface prior to resist pattern formation, for example in silicon solar cell fabrication.

BACKGROUND OF THE INVENTION

Solar cells are photovoltaic cells or modules, which convert sunlight directly into electricity. Photovoltaic (PV) cells are made of semiconductors, most commonly silicon. When light strikes the cell, a certain portion of it is absorbed within the semiconductor material, such that the energy of the absorbed light is transferred to the semiconductor and an electrical current is produced. By placing metal contacts on the top and bottom of the PV cell, the current can be drawn off to use externally. The current, together with the cell's voltage, defines the wattage that the solar cell can produce.

Silicon, especially in its crystalline form, is a common material used for producing solar cells. Most solar cells are made from crystalline silicon, doped with boron and phosphorus to produce a p-type/n-type junction. Polycrystalline silicon can be used in solar cell fabrication to cut manufacturing costs, although the resulting cells may not be as efficient as single crystal silicon cells. Amorphous silicon, which has no crystalline structure, may also used, again in an attempt to reduce production costs. Other materials used in solar cell fabricated include gallium arsenide, copper indium diselenide and cadmium telluride.

A typical arrangement of a silicon solar cell is as follows:
(a) a back contact;
(b) a P-type Si;
(c) an N-type Si;
(d) an antireflective coating;
(e) a contact grid; and
(f) a cover glass.

Because silicon is extremely reflective, an antireflective coating is typically applied to the top of the cell to reduce reflection losses. A glass cover plate is typically applied over the antireflective layer to protect the cell from the elements.

Low and medium efficiency solar cells are preferably produced in an efficient manner in order to keep the overall costs as low as possible. As such, these solar cells may be manufactured in a continuous, high throughput line in which handling of the wafers is kept to a minimum. The number of process steps is kept as low as possible and the process steps are selected so as to allow continuous processing with no or minimal interruption.

Conventional solar cells can be made using crystalline silicon wafers. The Si (+4) wafer starts as a p-type with a boron (+3) dopant. To better capture light, the wafer may be texturized with hydroxide or nitric/hydrofluoric acids so that light is obliquely reflected into the silicon. The p-n junction is formed by diffusion with phosphorus using vapor deposition and a surface passivation layer is applied, again in vacuum equipment, to impart the silicon nitride film.

In a standard process of silicon solar cell fabrication, the front side of the silicon wafer is coated with an anti-reflective passivation layer, which is typically comprises silicon nitride. This silicon nitride layer serves the dual purpose of maximizing the percentage of light absorbed by the cell (not reflected), as well as passivating the surface, which prevents electron recombination at the surface and thus increases cell efficiency.

After anti-reflective coating deposition, the cell is typically patterned with a frit-containing silver paste, using a screen printing method. The silver paste is then fired in order to penetrate the nitride passivation layer and form an electrically conductive contact with the bulk silicon material. At the same time, the circuit can be completed on the backside of the cell, for example with aluminum and silver pastes, silver to make contact with silicon and aluminum to form a back surface field.

As described for example in U.S. Pat. No. 5,698,451, the subject matter of which is herein incorporated by reference in its entirety, a typical method for forming a silicon solar cell involves the following steps: (1) providing a silicon substrate which has a p-n junction and a layer of silicon nitride on its front surface (adjacent the junction), (2) selectively coating the silicon nitride layer with a paste or ink that contains silver particles and a glass frit, so that the coating forms a selected contact pattern on the silicon nitride, and (3) heating the substrate to a temperature in excess of about 750° C., for a time sufficient to rapidly cause the silver/glass frit coating to penetrate the silicon nitride layer and form an ohmic contact on the front surface of the substrate.

The '451 patent also discloses a process involving the following steps: (1) providing a silicon substrate which has a p-n junction and a layer of silicon nitride on the front surface, (2) coating the back side of the silicon substrate with an aluminum paste, (3) heating the silicon substrate to rapidly and efficiently cause the aluminum to form an adherent conductive back side contact, (4) coating the silicon nitride with a paste containing silver particles and glass frit so as to form a grid-shaped electrode pattern on the silicon nitride, and (5) heating the substrate to a temperature in excess of 760° C., for a period of time sufficient to cause the metal and frit components in the paste to penetrate the silicon nitride layer and form an adherent conductive front side contact.

There are several notable disadvantages to the current method of patterning silicon solar cells including (1) breakage due to contact involved with screen printing; (2) loss of cell efficiency due to shading of the front side of the cell because of the grid; and (3) loss of cell efficiency due to improper electrical contact between the silver paste and the underlying silicon due to incomplete nitride dissolution and other contaminants present at the silver/silicon interface.

Therefore, improvements to the current screen printing method for patterning solar cells are desirable.

Conductor formation techniques as an alternative to screen printing paste have also been suggested, including for example deposition of inkjet resist and etch of the anti-reflective coating (ARC), aerosol deposition of silver paste, laser ablation of ARC and photolithography. Thereafter, electroless and/or electrolytic plating can be used to build the conductor. For example, a thin layer of electroless nickel can be used to make electrical contact to the silicon which can then be plated with copper—the thin layer of nickel is generally necessary to prevent the copper from poisoning the silicon.

However, further improvements are still needed with these alternative conductor formation techniques.

SUMMARY OF THE INVENTION

It is an object of the present invention to provide an improved method of patterning silicon solar cells to form a conductor on a surface thereof.

It is another object of the present invention to provide a treatment for modifying the surface of the anti-reflective layer to improve the definition of the resist deposited on the coating.

To that end, the present invention relates generally to a method of forming a resist pattern on a silicon semiconductor substrate having an anti-reflective layer thereon, the method comprising the steps of:
a) modifying surface energy of the anti-reflective surface with a chemical treatment composition;
b) applying a UV etch resist to the treated anti-reflective surface; and
c) exposing the anti-reflective surface to a wet chemical etchant composition to remove exposed areas of the anti-reflective surface.

DETAILED DESCRIPTION OF THE PREFERRED EMBODIMENTS

Figure 1:
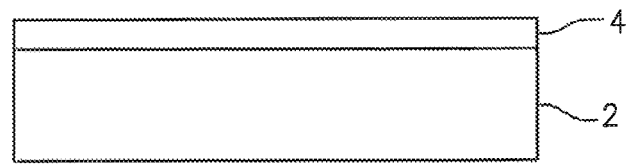
FIG. 1 depicts a silicon semiconductor substrate having a silicon nitride anti-reflective layer thereon.
Figure 2:
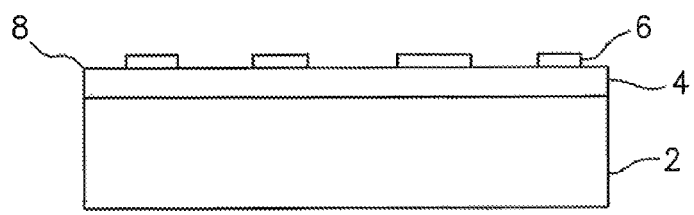
FIG. 2 depicts the silicon semiconductor substrate after it has been contacted with a fluoroine-containing surfactant and an etch resist has been applied to create a pattern of etch resist.
Figure 3:
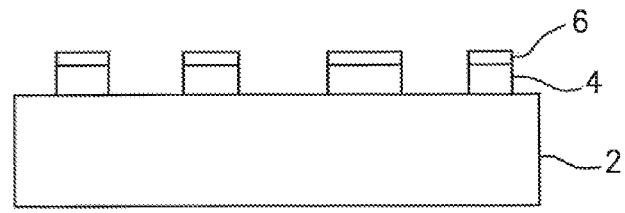
FIG. 3 depicts the silicon semiconductor substrate after it has been contacted with a chemical etchant composition.
Figure 4:
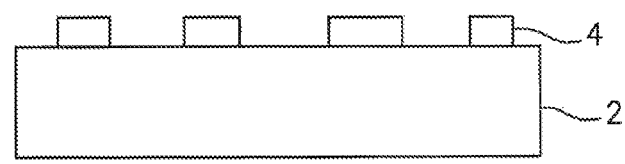
FIG. 4 depicts the silicon semiconductor substrate after the etch resist has been stripped away.
Figure 5:
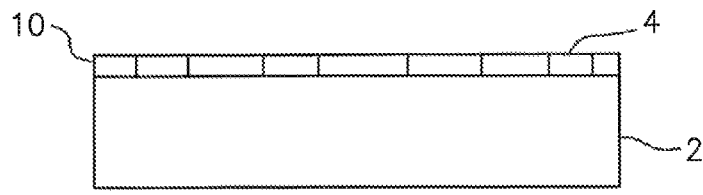
FIG. 5 depicts the silicon semiconductor substate after a metal coating is applied to the exposed areas.

The present invention relates generally to the formation of a resist pattern on a silicon semiconductor surface for the ultimate purpose of conductor formation. In one embodiment of the invention, as shown in FIGS. 1 and 2, a resist pattern 6 is deposited on the front side of a silicon cell 2 which has been previously coated with an anti-reflective passivation layer 4. The area of the anti-reflective layer 4 exposed after pattern formation is selectively etched by a wet chemical process, and shown in FIGS. 3 and 4, and is then sequentially plated with various metals in order to form a front side conductor, as shown in FIG. 5. The resist 6 is preferentially stripped from the silicon surface prior to a metal deposition process.

The present invention relates generally to a method of forming a resist pattern 6 on a solar cell silicon semiconductor substrate 2 having an anti-reflective layer 4 thereon, the method comprising the steps of:
a) modifying surface energy of the anti-reflective layer by contacting the anti-reflective layer 4 with a composition comprising a fluorine-containing surfactant 8;
b) applying an etch resist 6 to the treated anti-reflective layer thereby creating exposed areas of the anti-reflective layer 4 and resist covered area 6 of the anti-reflective layer 4;
c) contacting the exposed areas of the anti-reflective layer 4 with a wet chemical etchant composition to remove the anti-reflective layer 4 in the exposed areas;
d) applying a metal coating 10 on the exposed areas; and
e) stripping away the etch resist 6.

The present method presents an alternative to conventional methods for front side conductor formation. In one embodiment, an etch resist is applied by an off-contact method, such as inkjet deposition of an ultraviolet (uv) curable resist. The silicon substrate, now patterned with the UV resist, is then exposed to a wet chemical etchant composition in order to remove the exposed areas of anti-reflective material and to expose the underlying silicon. After the resist material is stripped and the silicon surface is cleaned, the exposed silicon pattern can be metallized by electroless deposition (or electrolytic deposition) of nickel, copper, silver, and/or other preferred metals, including combinations of one or more of such metals. The metal may also undergo a heat treatment ("sintering") process in order to improve adhesion and its electrical contact to the silicon substrate.

Subsequently, the exposed substrate can be further metallized to build a conductor pattern thereon. In addition, the metallized conductor pattern can be sintered to improve adhesion of the metallized conductor pattern to the silicon substrate.

In one embodiment, the surface of the anti-reflective layer is treated with a composition which will decrease the surface energy of the anti-reflective layer surface. This decrease in surface energy increases the resolution of the process of applying the resist, thus giving the resist image more fidelity to the theoretical image to be applied. The inventor has discovered that a chemical treatment composition comprising a solution of a fluorine-containing surfactant in an alcohol such as iso-propanol and/or water will beneficially decrease the surface energy of the anti-reflective coating surface. The solution may contain about 0.01% to about 5.0% by weight of the fluorine containing surfactant and an alcohol and/or water and may be applied by spray coating, immersion coating or an immersion process. Depending upon the fluorosurfactant chosen, they can be dissolved in water, solvents such as alcohol, or combinations thereof.

Treatment of the anti-reflective surface with the fluorine-containing surfactant results in a decrease in the surface energy of the surface, and thus a reduction in the spread of the resist material during deposition. The reduced spread of inkjet deposited resin allow for printing of finer resolution features.

Examples of suitable fluorine-containing surfactants that are usable in the practice of the present invention include perfluoroalkyl sulfonic acid and salts thereof, perfluoroalkyl phosphates, perfluoroalkyl amines, perfluoroalkyl sulfonates and perfluoroalkyl oxides, by way of example and not limitation. These fluorosurfactants can be cationic, anionic, non-ionic, or amphoteric. Anionic fluorosurfactants are preferred. Suitable commercial fluorosurfactants include ZONYL® FSO, FSN, FS62, FSA, FSP or FSE, each available from DuPont. Also suitable are CAPSTONE® FS10 and FS50. Another suitable fluorosurfactant is FLUORAD® FC-135 available from 3-M.

The UV etch resist is applied according to a negative of a predetermined electrode pattern, so that the electrode pattern can thereafter be formed on exposed surfaces of the silicon substrate. One suitable electrode pattern is a grid electrode comprising a plurality of narrow fingers attached at one end to a bus bar or runner. As discussed above, it is desirable to apply the etch resist by an off-contact method such as UV inkjet deposition.

Once the UV etch resist has been applied, etching of the silicon-based dielectric material (e.g., nitride, oxide and oxynitride) can be accomplished using a wet etchant based for example on hydrofluoric acid or other fluorine containing species. Other wet chemical etchants, including sulfuric acid, are known to those skilled in the art and would be usable in the practice of the present invention.

Silicon nitride remaining on the front side of the finished devices serves as an effective anti-reflective coating.

It is also to be understood that the following claims are intended to cover all of the generic and specific features of the invention described herein and all statements of the scope of the invention which as a matter of language might fall therebetween.

What is claimed is:

1. A method of forming an etch resist pattern on a silicon semiconductor substrate having a silicon nitride anti-reflective layer thereon, the method comprising the steps of:
   a) modifying surface energy of the anti-reflective layer by contacting the anti-reflective layer with a composition comprising a fluorine-containing surfactant,
   wherein the fluorine-containing surfactant is selected from the group consisting of perfluoroalkyl sulfonic acids and salts thereof, perfluoroalkyl phosphates, perfluoroalkyl amines, perfluoroalkyl oxides and perfluoroalkyl sulfonates, and
   wherein the composition comprising the fluorine containing surfactant comprises between about 0.01% and about 1.0% by weight of the fluorine containing surfactant;
   b) applying an etch resist to the treated anti-reflective layer to create a pattern of etch-resist comprising exposed areas of the anti-reflective layer and etch-resist covered areas of the anti-reflective layer;
   c) contacting the exposed areas of the anti-reflective layer with a chemical etchant composition to remove the anti-reflective layer in the exposed areas;
   d) stripping away the etch resist; and
   e) applying a metal coating on the exposed areas.

2. The method according to claim 1, wherein the metal coating is applied by plating.

3. The method according to claim 2, wherein the metal coating is created by electroless or electrolyte plating a metal selected from the group consisting of nickel, copper, silver, and combinations of one or more of the foregoing.

4. The method according to claim 2, comprising the step of sintering the metal coating to improve adhesion of the metal coating to the silicon substrate.

5. The method according to claim 1, wherein the etch resist is applied to the substrate by an off contact method.

6. The method according to claim 5, wherein the etch resist is applied by inkjet printing.

7. The method according to claim 6, wherein the etch resist is a UV etch resist.

* * * * *